(12) United States Patent
Fan et al.

(10) Patent No.: US 8,853,834 B2
(45) Date of Patent: Oct. 7, 2014

(54) LEADFRAME-TYPE SEMICONDUCTOR PACKAGE HAVING EMI SHIELDING LAYER CONNECTED TO GROUND

(71) Applicant: Powertech Technology Inc., Hsinchu (TW)

(72) Inventors: Wen-Jeng Fan, Hsinchu (TW); Che-Min Chu, Hsinchu (TW); Ming-Yen Wu, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 183 days.

(21) Appl. No.: 13/714,023

(22) Filed: Dec. 13, 2012

(65) Prior Publication Data

US 2014/0167231 A1 Jun. 19, 2014

(51) Int. Cl.
*H01L 23/552* (2006.01)
*H01L 23/495* (2006.01)
*H01L 23/00* (2006.01)
*H01L 23/31* (2006.01)

(52) U.S. Cl.
CPC ....... *H01L 23/552* (2013.01); *H01L 2924/1434* (2013.01); *H01L 2224/48247* (2013.01); *H01L 23/49541* (2013.01); *H01L 2224/32245* (2013.01); *H01L 24/73* (2013.01); *H01L 2224/48091* (2013.01); *H01L 24/32* (2013.01); *H01L 2924/3025* (2013.01); *H01L 2224/04042* (2013.01); *H01L 2924/14* (2013.01); *H01L 2924/10253* (2013.01); *H01L 2924/1431* (2013.01); *H01L 24/48* (2013.01); *H01L 23/3107* (2013.01); *H01L 2224/73265* (2013.01); *H01L 2224/48257* (2013.01); *H01L 23/4951* (2013.01)
USPC .......................................... 257/659; 438/123

(58) Field of Classification Search
USPC .......................................... 257/659; 438/123
See application file for complete search history.

(56) References Cited

U.S. PATENT DOCUMENTS

| 5,294,826 A | 3/1994 | Marcantonio et al. |
| 6,365,960 B1 * | 4/2002 | Pollock et al. ................. 257/659 |
| 7,808,087 B2 | 10/2010 | Zhao et al. |
| 2009/0146269 A1 * | 6/2009 | Chow et al. .................... 257/659 |
| 2011/0049685 A1 * | 3/2011 | Park et al. ...................... 257/660 |

* cited by examiner

*Primary Examiner* — Daniel Whalen
(74) *Attorney, Agent, or Firm* — Muncy, Geissler, Olds & Lowe, P.C.

(57) ABSTRACT

Disclosed is a leadframe-type semiconductor package having an EMI shielding layer connected to ground, comprising a leadframe, a chip, an encapsulant, and an EMI shielding layer. The encapsulant has two lead-extending sides and two leadless sides. The EMI shielding layer covers at least one surface of the encapsulant and the leadless sides. A metal tie bar coupling to the die attach pad of the leadframe has a cut end aligned with and exposed on one of the leadless sides. A ground lead also has a cut end aligned with and exposed on one of the leadless sides Since the EMI shielding layer covers and electrically connects the cut ends of the metal tie bar and the ground lead, the die pad with its metal tie bar of the leadframe is connected to the ground lead through external electrical connection outside the encapsulant to allow the die pad having ground potential.

13 Claims, 5 Drawing Sheets

LEADFRAME-TYPE SEMICONDUCTOR PACKAGE HAVING EMI SHIELDING LAYER CONNECTED TO GROUND

FIELD OF THE INVENTION

The present invention relates to a semiconductor package and more specifically to a leadframe-type semiconductor package having an EMI shielding layer connected to ground.

BACKGROUND OF THE INVENTION

Electromagnetic Interference (EMI) affects the electrical performance of various electronic devices, all the more, causes damages inside the electronic devices. Among the existing semiconductor packages, various EMI shielding structures have been proposed and built to isolate external EMI. However, the first priority to isolate external EMI is to have a good electrical connection to ground potential. Without appropriate grounding of EMI shielding structures, not only can external EMI not be isolated but also induce more serious EMI noise.

EMI shielding structures can be sorted into internal and external types where not one-single EMI shielding structure can fit for all packages, especially for leadframe-type semiconductor packages with signal leads and ground leads on the same side which will be more difficult to connect EMI shielding structures to the ground.

As revealed in U.S. Pat. No. 7,808,087, entitled "Leadframe IC packages having top and bottom integrated heat spreaders", Zhao et al taught that an internal type EMI shielding structure consists of first and second caps inside a die-up or die-down package where the first and second caps define a die cavity. A leadframe includes a centrally located die attach pad, a plurality of leads, and a plurality of tie bars coupling to the die attach pad. An IC die is mounted to the die attach pad. Planar rim portions of the first and second caps that surround the cavity are coupled to the leadframe. The first and second caps and the leadframe form an enclosure structure that substantially encloses the IC die and shields EMI emanating from and radiating toward the IC die. The enclosed structure also dissipates heat generated by the IC die during operation. However, the revealed EMI shielding structure greatly interferes the formation of encapsulant where die sizes and leadframe layouts are quite limited.

As revealed in U.S. Pat. No. 5,294,826, entitled "Integrated circuit package and assembly thereof for thermal and EMI management", Marcantonio et al taught that a heat spreader is disposed on the top surface of an encapsulant of a package as an EMI shielding structure where the heat spreader is called as a combined heat dissipating and EMI electromagnetic shielding structure. The die attach pad is electrically connected to the ground lead(s) through bonding wires where the heat spreader is attached to the bottom of the die attach pad so that the heat spreader is also electrically connected to the ground. However, this EMI shielding structure would encounter unbalanced mold flows between top and bottom molds when the encapsulant is formed where the leadframe design implemented for the leadframe-type package is quite limited. Moreover, when the die attach pad is too small or there is not enough wire bonding space for electrical connections between the die attach pad and ground leads within the limited molding space of a leadframe, the heat spreader loses its EMI shielding effect.

SUMMARY OF THE INVENTION

The main purpose of the present invention is to provide a leadframe-type semiconductor package having EMI shielding layer connected to ground to achieve the EMI shielding effect where the EMI shielding layer connects the ground pin to hard-to-ground parts of a leadframe inside the encapsulant, for example the die attach pad is ground connected outside the encapsulant.

According to the present invention, a leadframe-type semiconductor package having EMI shielding layer connected to ground is revealed, the package comprises a leadframe, a chip, an encapsulant, and an EMI shielding layer. The leadframe includes a plurality of signal leads, at least a ground lead, and a die attach pad where the die attach pad is coupled to at least a metal tie bar. The chip is disposed on the die attach pad and is electrically connected to the signal leads. The encapsulant encapsulates the chip where the encapsulant has a first surface, a second surface, two opposing lead-extending sides, and two opposing leadless sides. The EMI shielding layer covers the first surface of the encapsulant and the leadless sides where the signal leads have a plurality of first external lead portions extending from the lead-extending sides of the leads. The first metal tie bar has a first cut end aligned with and exposed on one of the leadless sides. The ground lead has a second external lead portion extending from one of the lead-extending sides and a second cut end aligned with and exposed on one of the leadless sides. Through the covering of the EMI shielding layer to electrically connect the first cut end with the second cut end, the die attach pad has ground potential through electrical connections from outside the encapsulant.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
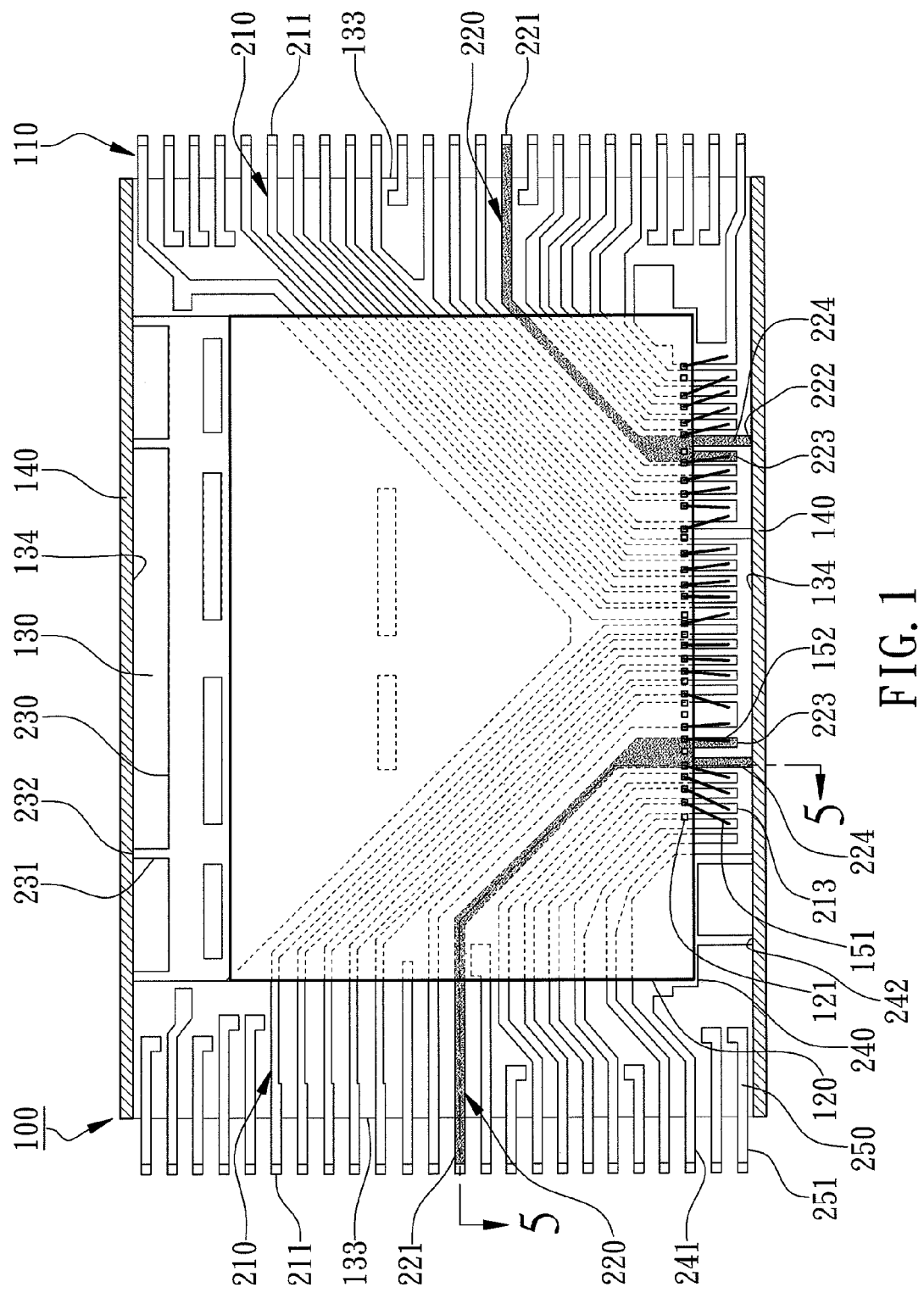
FIG. 1 is a perspective top view of a leadframe-type semiconductor package having EMI shielding layer connected to ground by seeing through its encapsulant according to the preferred embodiment of the present invention.
Figure 2:
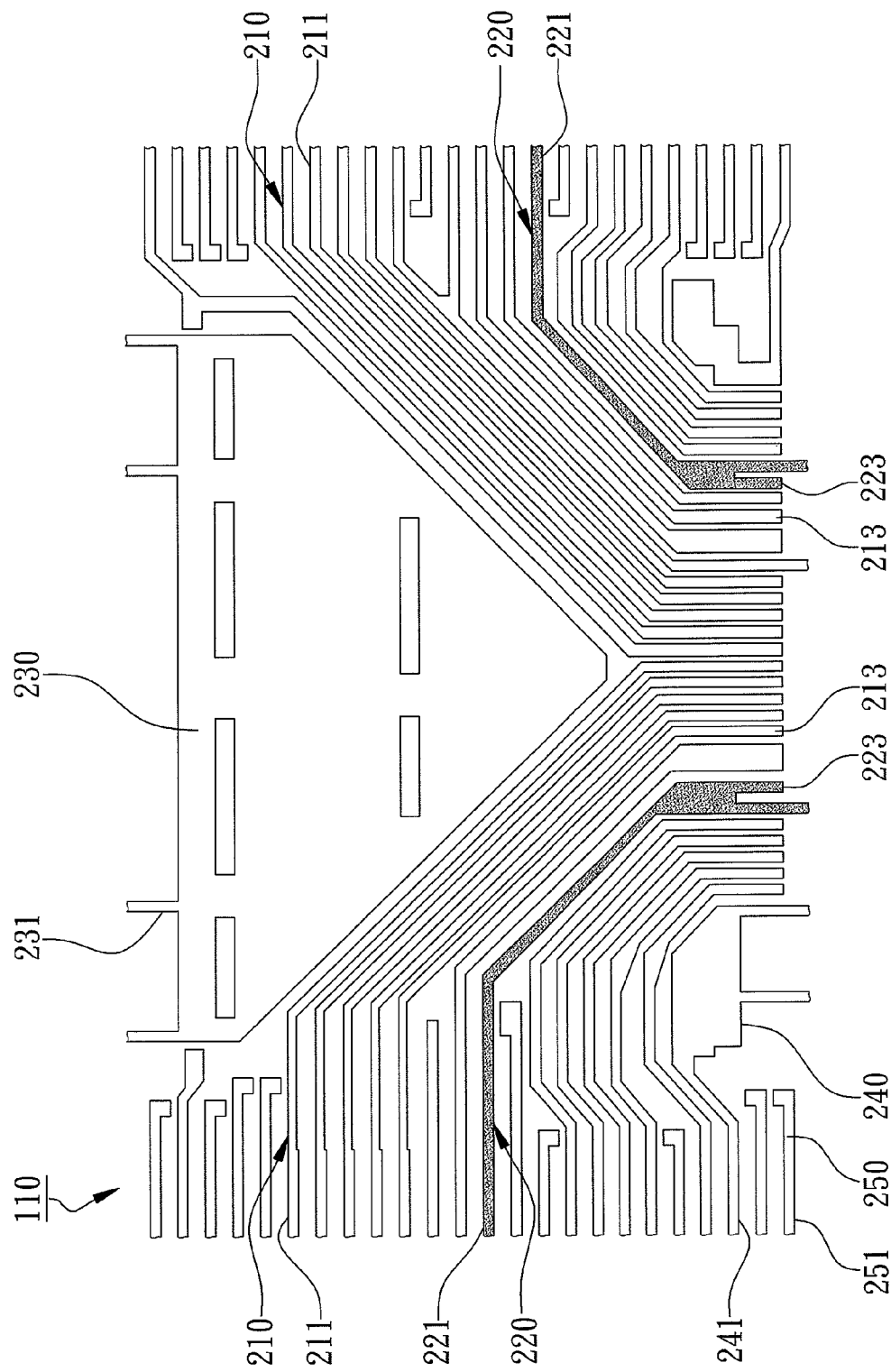
FIG. 2 is a partial perspective top view of a corresponding packaging unit of a leadframe for the leadframe-type semiconductor package before packaging processes according to the preferred embodiment of the present invention.
Figure 3:
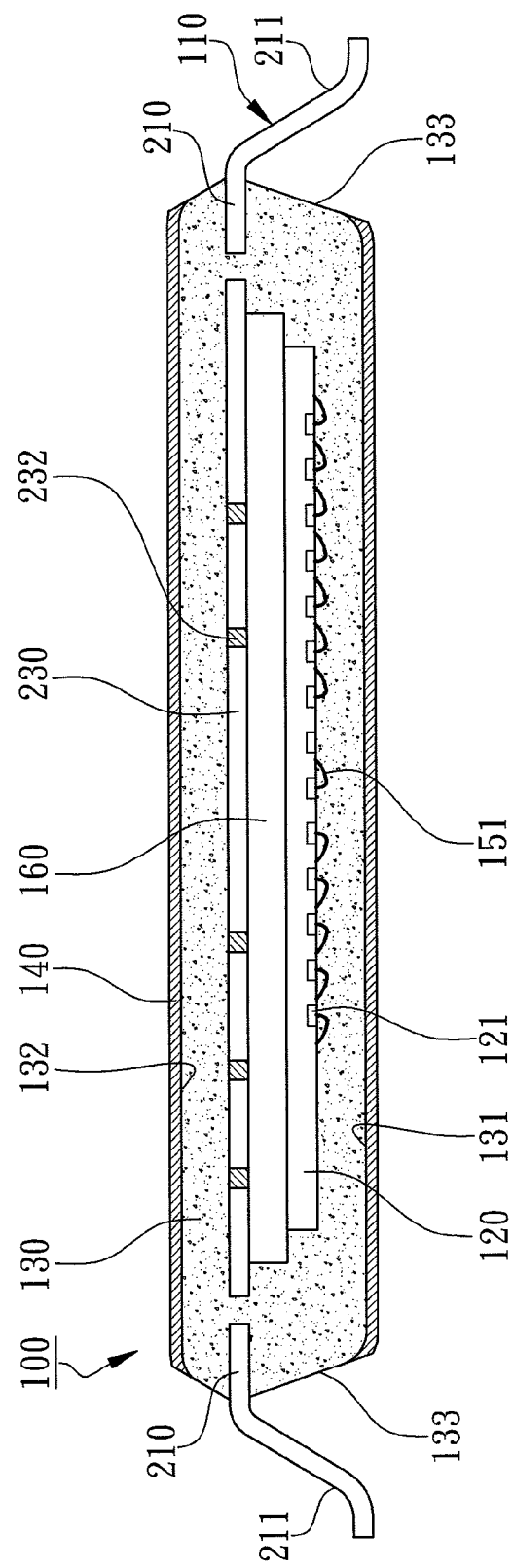
FIG. 3 is a cross-sectional view showing the lead-extending sides of the leadframe-type semiconductor package according to the preferred embodiment of the present invention.
Figure 4:
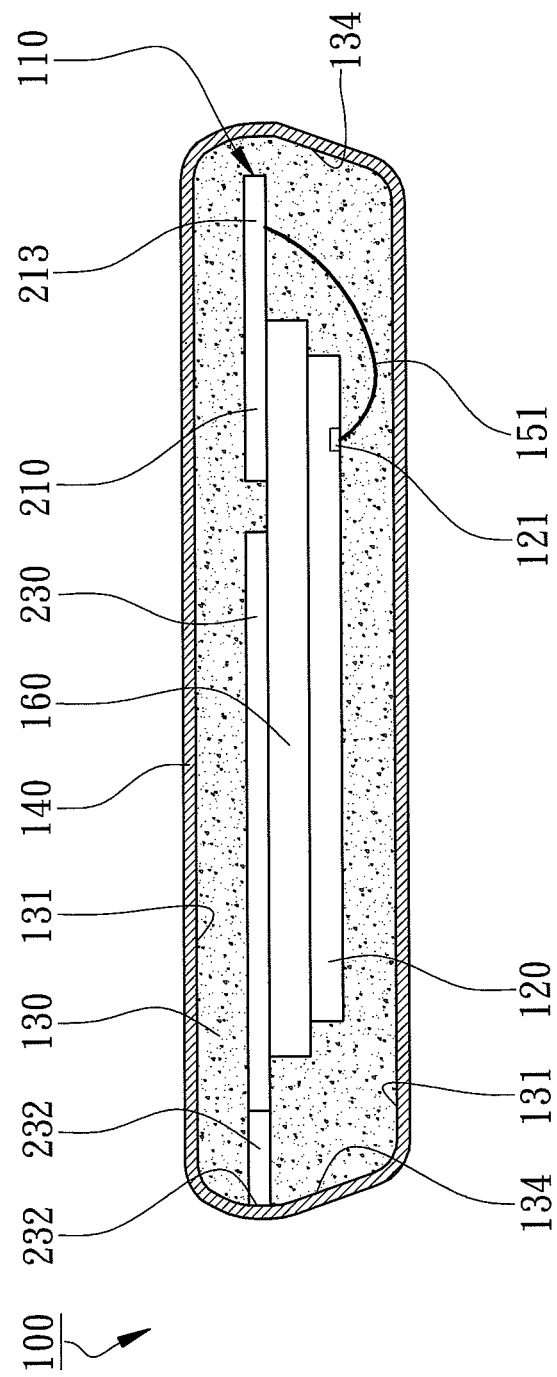
FIG. 4 is a cross-sectional view showing the leadless sides of the leadframe-type semiconductor package according to the preferred embodiment of the present invention.
Figure 5:
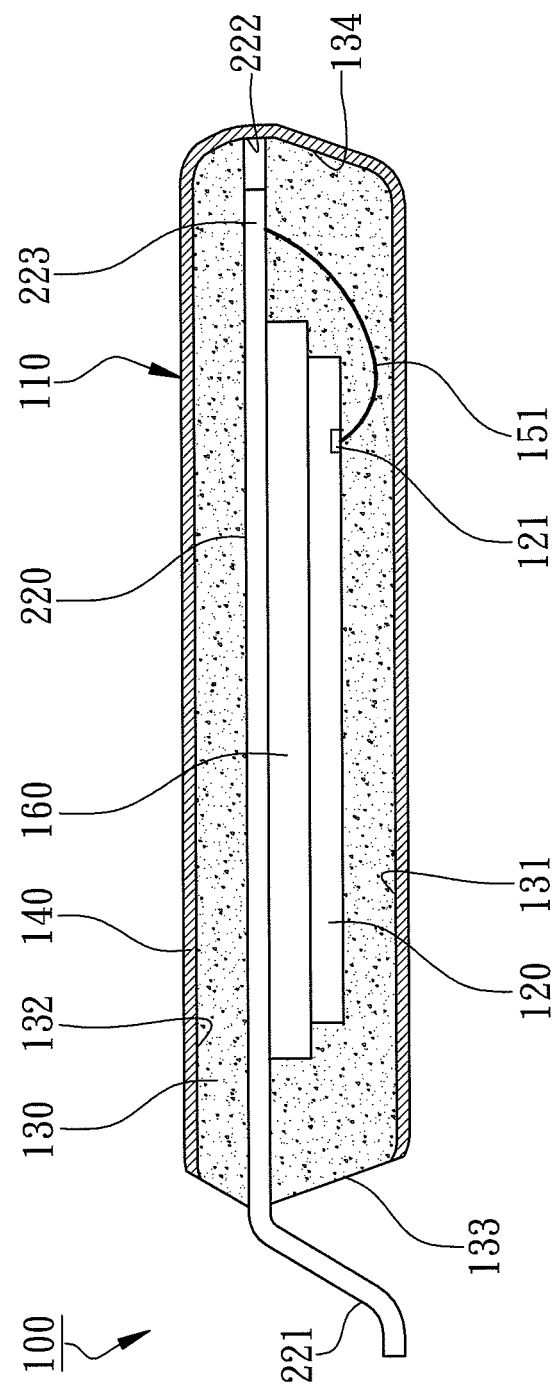
FIG. 5 is a cross-sectional view along a ground lead of the leadframe-type semiconductor package according to the preferred embodiment of the present invention.

According to the preferred embodiment of the present invention, a leadframe-type semiconductor package having EMI shielding layer connected to ground is disclosed and illustrated in FIG. 1 for a perspective top view by seeing through its encapsulant. The leadframe-type semiconductor package 100 comprises a leadframe 100, a chip 120, an encapsulant 130, and an EMI shielding layer 140. The leadframe 110 is illustrated in FIG. 2 for a partial perspective top view of a corresponding packaging unit before packaging processes where the leadframe 110 is a metal frame to carry and electrically connect to the chip 120. The components of the leadframe 110 such as leads and die attach pad are made of the same metal material such as iron or copper alloys. As shown in FIGS. 1, 3, and 4, the encapsulant 130 has two opposing lead-extending sides 133 and two opposing leadless sides 134 between a first surface 131 and a second surface 132 where the lead-extending sides 133 are to arrange the external leads of a leadframe and the leadless sides 134 are the sides or corners without any leads of a leadframe. The cross-sectional view showing the lead-extending sides 133 is illustrated in FIG. 3, the cross-sectional view showing the leadless sides 134 is illustrated in FIG. 4, and the cross-sectional view along one of the ground leads (as shown in 5-5 cross-sectional line in FIG. 1) is illustrated in FIG. 5.

As shown in FIG. 1 and FIG. 2, the leadframe 110 includes a plurality of signal leads 210, at least a ground lead 220, and a die attach pad 230. The die attach pad 230 is coupled to at least a first metal tie bar 231 so that the die attach pad 230 can integrally couple to the metal frame body of the leadframe 110 to carry the chip 120. The signal leads 210 are to transmit electrical I/O signals of the chip 120 and the ground lead 220 is to electrically connect the ground signal of the chip 120 to the external printed circuit board. In this embodiment, at least one of the signal leads 210 is located between the ground lead 220 and the die attach pad 230 as shown in FIG. 1, so that the ground lead 220 can not be directly and integrally connected to the die attach pad 230 by other parts of the leadframe 110. Since the connection of the ground lead 220 is one of the major features of the present invention, therefore, the ground lead 220 is highlighted with specific shadowed area for easy recognition and understanding. In the actual package structure, the ground lead 220 has the same metal gloss as the signal leads 210. The signal leads 210 have a plurality of first external lead portions 211 extending from the lead-extending sides 133 and the ground lead 220 has a second external lead portion 221 extending from one of the lead-extending sides 133, i.e., the external lead portions 211 and 221 of the signal leads 210 and the ground lead 220 are arranged on the same side at the lead-extending sides 133. After the leadframe 110 is singulated into individual leadframe-type semiconductor packages, the first metal tie bar 231 coupled to the die attach pad 230 has a first cut end 232 aligned with and exposed on one of the leadless sides 134 of the encapsulant 130 as shown in FIG. 1 and FIG. 4. The ground lead 220 also has a second cut end 222 aligned with and exposed on one of the leadless sides 134 as shown in FIG. 1 and FIG. 5, i.e., the first metal tie bar 231 and the ground lead 220 have their own cut ends 232 and 222 exposed on the leadless sides 134 which is the major feature of leadframe component disposition of the present invention. In the present embodiment, the first cut end 232 and the second cut end 222 are located at the two different leadless sides 134 of the encapsulant 130 respectively. Furthermore, the inner portions of the signal leads 210 and the ground lead 220 are horizontally and inwardly bent from both lead-extending sides 133 toward to one of the leadless sides 134. In a more specific leadframe structure, the leadframe 110 further has at least a dummy lead 250 having a fourth corresponding external lead portion 251 also extending from one of the lead-extending sides 133. The so-called "dummy lead"

means that a lead is not electrically connected to neither I/O signal leads nor ground leads, i.e., the breaking of the solder joint of the fourth external lead portion 251 of the dummy lead 250 will not impact nor cause failure of the electrical performance of the packages, therefore, the dummy lead 150 is implemented to increase the reliability of the packages after SMT processes. The internal end of the dummy lead 250 can be L-shaped or has through holes to increase the adhesion to the encapsulant 130.

The chip 120 is disposed on the die attach pad 230 and is electrically connected to the signal leads 210. The dimension of the chip 210 can be larger than the dimension of the die attach pad 230 where the shape of the die attach pad 230 can be triangle or other shapes without affecting the disposition of the leads. The chip 120 can be further disposed on the signals leads 210 and the ground lead 220. Furthermore, the leadframe 110 further has at least a corner die attach pad 240 aligned to one of the corners of the chip 120 where the corner die attach pad 240 has a third external lead portion 241 also extending from the lead-extending sides 133 to increase the carrying capability of the die 120 and further has a third cut end 242 aligned with and exposed on one of the leadless sides 134 to be externally ground-connected by the EMI shielding layer 140. In the present embodiment, the leadframe-type semiconductor package 100 further comprises a spacer 160 such as a tape or a dummy chip disposed between the die attach pad 230 and the chip 120 to increase the support to the die 120 and to ensure electrical isolation of the chip 120 to the signal leads 210 and the ground lead 220.

The chip 120 is made of conventional semiconductor materials such as Si with IC circuitry such as memory or logic fabricated on the active surface where a plurality of bond pads 121 are disposed thereon as external electrical connections for the chip 120. In the present embodiment, the signal leads 210 further have a plurality of first inner fingers 213 and the ground lead 220 further has a second inner lead finger 223 where the first inner fingers 213 and the second inner fingers 223 are linearly arranged along a chip side adjacent to the bond pads 121 of the chip 120. The leadframe-type semiconductor package 100 further comprises a plurality of first bonding wires 151 and a second bonding wire 152 where the first bonding wires 151 electrically connect the first inner fingers 213 with the corresponding signal bond pads 121 of the chip 120 and the second bonding wire 152 electrically connects the second inner finger 223 with the corresponding ground bond pad 121 of the chip 120. In the present embodiment, the chip 120 may not need to electrically connect to the die attach pad 230 through bonding wires and the ground lead 220 may not need to electrically connect the die attach pad 230 to the internal structure of the package unit of the leadframe 110, it is still possible to achieve the die attach pad having ground potential, i.e., to have EMI shielding effects through electrically connecting from the external lead portion to the internal portion to greatly increase the design flexibility of the leads of a leadframe and the disposition of the die attach pad.

The encapsulant 130 encapsulates the chip 120 where the encapsulant 130 has the first surface 131 and the second surface 132, where the lead-extending sides 133 and the leadless sides 134 are formed between the first surface 131 and the second surface 132. The encapsulant 130 is a composite material having the features of electrical isolation and thermosetting to encapsulate the chip 120 which is so-called Epoxy Molding Compound (EMC). In a more specific embodiment, the encapsulant 130 not only encapsulates the chip 120 but also encapsulates and couples the electrically isolated components of the leadframe 110 after singulation to be one individual package such as electrically isolation between the signal leads 210 and between the signal leads 210 and the ground lead 220. Moreover, the first surface 131 is relatively away from the die attach pad 230 so that the chip 120 is located between the first surface 131 and the die attach pad 130. In the present embodiment, the first surface 131 is the bottom surface of the package after SMT processes and the second surface 132 is the top surface of the package after SMT processes.

The EMI shielding layer 140 can be a metal film or a conductive coating disposed outside the encapsulant 130 where the EMI shielding layer 140 at least covers the first surface 131 and the leadless sides 134 of the encapsulant 130. The EMI shielding layer 140 does not connect to the signal leads 210 at the lead-extending sides 133. Preferably, the EMI shielding layer 140 further covers the second surface 132 of the encapsulant 130. The die attach pad 230 is adjacent to the second surface 132 without contacting with the EMI shielding layer 140 to be completely encapsulated by the encapsulant 130 for a better mold flow balance. Additionally, through the covering of the EMI shielding layer 140 on the leadless sides 134 to electrically connect the first cut end 232 of the first metal tie bar 231 with the second cut end 222 of the ground lead 220, the die attach pad 230 and the connected first metal tie bar 231 can be electrically connected to the ground lead 220 through the first cut end 232, the EMI shielding layer 140 disposed outside the encapsulant 130 and the second cut end 222. Therefore, the die attach pad 230 disposed inside the encapsulant 130 can be electrically connected to the ground lead 220 disposed inside the encapsulant 130 through the EMI shielding layer 140 disposed outside the encapsulant 130. Since the chip 120 is located between the die attach pad 230 and the first surface 131 of the encapsulant 130 covered by the EMI shielding layer 140, the EMI shielding layer 140 in the present invention can provide a better EMI shielding effect to the chip 120 by internal electrically ground connection to the ground lead 220 and the internal electrical ground connection of the die attach pad 230.

In a preferred embodiment, the ground lead 220 has a second metal tie bar 224 where the second cut end 222 is formed at one cut end of the second metal tie bar 224. The second metal tie bar 224 and the second inner finger 223 are connected in U-shaped without affecting the wire bonding of the ground lead 220.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:

1. A leadframe-type semiconductor package comprising:
   a leadframe including a plurality of signal leads, at least a ground lead, and a die attach pad, wherein the die attach pad is coupled to at least a first metal tie bar;
   a chip disposed on the die attach pad and electrically connected to the signal leads;
   an encapsulant encapsulating the chip, wherein the encapsulant has a first surface, a second surface and further has two opposing lead-extending sides and two opposing leadless sides between the first surface and the second surface; and
   an Electromagnetic Interference (EMI) shielding layer covering the first surface of the encapsulant and the leadless sides;
   wherein the signal leads have a plurality of first external lead portions extending from the lead-extending sides, the first tie bar has a first cut end aligned with and exposed on one of the leadless sides, the ground lead has a second external lead portion extending from one of the lead-extending sides and a second cut end aligned with and exposed on one of the leadless sides, through the covering of the EMI shielding layer to electrically connect the first cut end with the second cut end, the die attach pad has ground potential through external electrical connection outside the encapsulant.

2. The semiconductor package as claimed in claim 1, wherein the first cut end and the second cut end are located at the two different leadless sides respectively.

3. The semiconductor package as claimed in claim 1, wherein the signal leads further have a plurality of first inner fingers and the ground lead further has a second inner finger, wherein the first inner fingers and the second inner finger are linearly arranged along a chip side adjacent to a plurality of bond pads of the chip.

4. The semiconductor package as claimed in claim 3, further comprising a plurality of first bonding wires and a second bonding wire, wherein the first bonding wires electrically connect the first inner fingers with the corresponding signal bond pads of the chip and the second bonding wire electrically connects the second inner finger with the corresponding ground bond pad of the chip.

5. The semiconductor package as claimed in claim 4, wherein the ground lead is coupled with a second metal tie bar, wherein the second cut end is formed at the cut end of the second metal tie bar and the second metal tie bar and the second inner fingers are connected in U-shaped.

6. The semiconductor package as claimed in claim 1, wherein the dimension of the die attach pad is smaller than the dimension of the chip so that the chip is further disposed on the signal leads and the ground lead.

7. The semiconductor package as claimed in claim 1, wherein the EMI shielding layer further covers the second surface of the encapsulant.

8. The semiconductor package as claimed in claim 7, wherein the die attach pad is adjacent to the second surface without contacting with the EMI shielding layer.

9. The semiconductor package as claimed in claim 1, further comprising a spacer disposed between the die attach pad and the die.

10. The semiconductor package as claimed in claim 1, wherein the leadframe further has at least a corner die attach pad aligned to one of the corners of the chip where the corner die attach pad has a third external lead portion extending from one of the lead-extending sides and a third cut end aligned with and exposed on one of the leadless sides.

11. The semiconductor package as claimed in claim 10, wherein the leadframe further has a least a dummy lead having a fourth external lead portion extending from one of the lead-extending sides.

12. The semiconductor package as claimed in claim 1, wherein at least one of the signal leads is located between the ground lead and the die attach pad.

13. The semiconductor package as claimed in claim 1, wherein the chip is located between the die attach pad and the first surface of the encapsulant.

* * * * *